US006753612B2

(12) United States Patent
Adae-Amoakoh et al.

(10) Patent No.: US 6,753,612 B2
(45) Date of Patent: Jun. 22, 2004

(54) ECONOMICAL HIGH DENSITY CHIP CARRIER

(75) Inventors: Sylvia Adae-Amoakoh, Binghamton, NY (US); John S. Kresge, Binghamton, NY (US); Voya R. Markovich, Endwell, NY (US); Thurston B. Youngs, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/827,014

(22) Filed: Apr. 5, 2001

(65) Prior Publication Data

US 2002/0145203 A1 Oct. 10, 2002

(51) Int. Cl.$^7$ ............................................... H01L 29/40
(52) U.S. Cl. ...................... 257/774; 257/690; 257/758; 257/778
(58) Field of Search ................................. 257/690, 691, 257/773, 778, 774, 758; 174/256, 266

(56) References Cited

U.S. PATENT DOCUMENTS

| 5,261,593 | A | | 11/1993 | Casson et al. |
|---|---|---|---|---|
| 5,372,666 | A | * | 12/1994 | Kawasaki ................ 156/89.15 |
| 5,665,650 | A | * | 9/1997 | Lauffer et al. ................ 216/20 |
| 5,706,178 | A | | 1/1998 | Barrow |
| 5,875,102 | A | | 2/1999 | Barrow |
| 6,010,769 | A | * | 1/2000 | Sasaoka et al. ............ 428/209 |
| 6,046,505 | A | | 4/2000 | Howard |
| 6,072,242 | A | | 6/2000 | Son |
| 6,329,610 | B1 | * | 12/2001 | Takubo et al. .............. 174/264 |

FOREIGN PATENT DOCUMENTS

| JP | 3161956 | 7/1991 |
|---|---|---|
| JP | 11330295 | 11/1999 |
| WO | WO 99/57762 | 11/1999 |

* cited by examiner

Primary Examiner—Nathan J. Flynn
Assistant Examiner—Leonardo Andujar
(74) Attorney, Agent, or Firm—Schmeiser, Olsen & Watts; William H. Steinberg

(57) ABSTRACT

A flip-chip joinable substrate having non-plated-on contact pads. The substrate has an external metal foil layer upon a dielectric layer upon a patterned internal metal layer having an internal contact area. An area of the external metal foil layer above the internal contact area is selected. A microvia cavity extending to the internal contact area is perforated centrally within the selected area and is filled with a mass of conductive paste forming an external contact pad. The external contact pad is used as an etch mask for removing the adjacent external metal foil.

20 Claims, 8 Drawing Sheets

ECONOMICAL HIGH DENSITY CHIP CARRIER

BACKGROUND OF THE INVENTION

1. Technical Field

The invention relates generally to a high semiconductor chip package, and more particularly, to a structure for flip-chip joinable contact pads on a surface of a chip carrier.

2. Related Art

The related art provides flip-chip assemblies including a substrate having plated-on attach pads for joining semiconductor chips or other substrates. Ball Grid Array (BGA) chip packages are typically constructed with a substrate (e.g., chip carrier) that supports the integrated circuit and which has a substrate core that is constructed with conventional printed circuit board processes, such as lamination. The exterior planar surfaces i.e., top and bottom surfaces) of the substrate each contain a plurality of exposed plated-on metal attach pads (e.g. plated-on copper pads). Typically, a solder ball is placed onto each exposed attach pad. The solder balls are then heated and reflowed to bond the balls to the plated-on metal attach pads. Each of the plated-on attach pads is then physically and electrically connected through the solder ball to a corresponding metallized pad on the chip's surface or on the surface of another substrate.

The related art forms the attach pads on the exterior surfaces of a substrate by employing metal plating techniques (e.g., electroless copper plating followed by Ni/Au plating). The metallization process typically employed to produce the plated-on attach pads of the related art comprises external plating steps and is relatively time consuming and expensive.

SUMMARY OF THE INVENTION

The present invention eliminates the need for surface metallization plating steps in the formation of external contact pads while providing an economical method of forming "flip-chip joinable" contact metallurgy on the surface(s) of a substrate (e.g, a high density chip carrier). As will be further described, the electrical connections between the substrate surface and a flip-chip and the resulting structure are constructed economically using selectively deposited conductive material (e.g., conductive paste, or solder paste).

Accordingly a structural aspect of the invention, provides a substrate having a dielectric layer between a first metal layer and a second metal layer, the second metal layer being disposed above the first metal layer, the first metal layer having a first contact area, the second metal layer having a selected area disposed above the first contact area; and a microvia cavity within the selected area being disposed through the second metal layer and through the dielectric layer and extending to the first contact area of the first metal layer; a mass of conductive material forming a layer upon the selected area of the second metal layer and being inside the microvia cavity and being in contact with the first contact area of the first metal layer.

Another feature of the present invention provides a method for forming contact pads on a substrate, comprising providing a substrate including a first metal surface and an external metal foil layer and a layer of dielectric material disposed between the first metal surface and the external metal foil layer; perforating the external metal foil layer and the dielectric layer to expose a portion of the first metal surface; selectively depositing a conductive material upon the exposed portion of the first metal surface and upon a peripheral area of the external metal foil layer around the exposed portion of the first metal surface; etching the external metal foil layer using the selectively deposited conductive material as an etch mask.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein:

FIG. 2A depicts a cross-sectional view of a multilayered interconnect substrate formed of alternating metal foil layers and dielectric lamination carrier layers, external metal foil layers being exposed on the top and bottom surfaces of the substrate;

FIG. 2B depicts a cross-sectional view of the multilayered interconnect substrate of FIG. 2A having perforations (called microvia cavities) in each external metal foil layer and having the perforations extend through the underlying dielectric layer to an underlying metal layer;

FIG. 2C depicts a cross-sectional view of the multilayered interconnect substrate of FIG. 2B after a mass of conductive material has been selectively deposited upon the surface of the external metal foil layer and has conformally filled the perforations;

FIG. 2D depicts a cross-sectional view of the multilayered interconnect substrate of FIG. 2C after the exposed non-selected area of the external metal foil layer on the surface(s) of the substrate has been etched off, using the mass of conductive material as an etch mask;

FIG. 3A depicts a cross-sectional view of the substrate depicted in FIG. 2A wherein a layer of a strippable mask has been applied upon the external metal foil layer surface(s) of the substrate;

FIG. 3B depicts a cross-sectional view of the substrate depicted in FIG. 3A wherein the strippable mask has been selectively removed (or selectively omitted) from a selected area of the external metal foil surface(s) above metal capture pads on a face of the substrate core, to form a screen hole for selective deposition of conductive/solder paste;

FIG. 3C depicts a cross-sectional view of the substrate depicted in FIG. 3B wherein the external metal foil layer surface(s) of the substrate and some of the underlying dielectric layer has been perforated within a microvia area above the metal capture pads on the face of the substrate core;

FIG. 3D depicts a cross-sectional view of the substrate depicted in FIG. 3B or FIG. 3C wherein the external metal foil surface and the underlying dielectric layer beneath the external metal foil surface has been perforated to form microvia cavities extending to an area of the metal capture pads on the face of the substrate core;

FIG. 3E depicts a cross-sectional view of the substrate depicted in FIG. 3D after the screen hole(s) in the strippable mask and the microvia cavity in the substrate have been conformally filled with conductive/solder paste;

FIG. 3F depicts a cross-sectional view of the multilayered interconnect substrate of FIG. 3E after the strippable mask has been stripped off and after the exposed metal foil on the surface(s) of the substrate has been etched off using the selectively deposited conductive/solder paste as an etch mask.

DETAILED DESCRIPTION OF THE INVENTION

Although certain exemplary embodiments of the present invention will be shown and described in detail, it should be understood that various changes and modifications may be made without departing from the scope of the appended claims. The scope of the present invention will in no way be limited to the number of constituent components, the materials thereof, the shapes thereof, the relative arrangements thereof, etc., and are disclosed simply as an example of embodiments of the invention. Although the drawings are intended to illustrate the present invention, the drawings are not necessarily drawn to scale.

Figure 1:
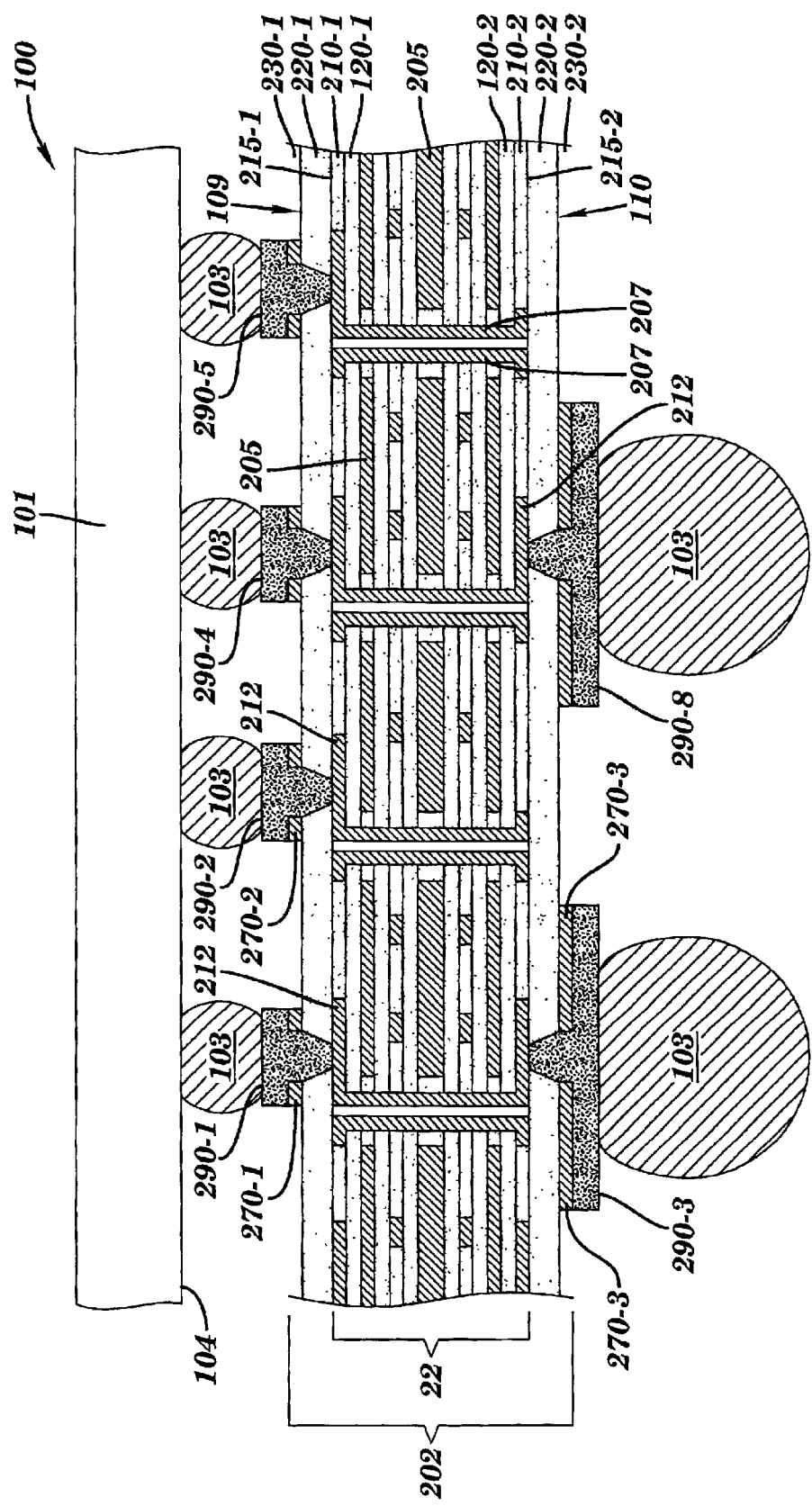
FIG. 1 depicts a cross-sectional view of a flip-chip assembly including an interconnection substrate having flip-chip joinable contact pads on its surface(s) that are formed without external metal plating steps, in accordance with embodiments of the present invention.

FIG. 1 is a schematic cross-sectional view of a flip-chip assembly 100 manufactured in accordance with embodiments of the invention. The assembly 100 includes an integrated circuit chip (e.g., flipped chip ("flip-chip") 101) mechanically and electrically attached to a surface 109 of the substrate 202 through (a plurality of) electrically conductive contact anchors 103 bonded respectively to (a plurality of respective) contact pads 290 (referring collectively to similar contact pads 290-1, 290-2, 290-3, 290-4, 290-5, 290-6, 290-7, 290-8, 290-9). The contact pads 290 have been formed upon the surface(s) (e.g. 109 and/or 110) of the substrate 202 without the employment of external metal plating steps, by employing an inventive method described below. The contact pads 290 are firmly bonded to the substrate 202 and may be considered an integral part of the substrate's surface(s) (109 and 110).

Construction of the flip-chip assembly involves the mounting of an unpackaged semiconductor chip 101, with the active side 104 facing down, to a multi-layered interconnect substrate (e.g., a chip carrier) 202 having any of various kinds of contact anchors 103 such as solder balls (as shown), solder columns, and/or nickel, gold or organic conductive adhesive bumps. The space around the (plurality of) contact anchors 103 and between the substrate 202 and the active side 104 of the chip 101 may be underfilled with a flowable dielectric material such as epoxy (not shown). The assembly 100 provides short interconnects (e.g. short contact anchors 103) which can handle high speed or high frequency signals.

The contact anchors 103 may be arranged in an array (e.g, a Ball Grid Array, BGA) pattern and bonded to a plurality of contact pads 290 that are arranged in the same array pattern on a surface (e.g., 110) of the substrate. The inventive assembly 100 can therefore be a BGA package. The substrate (e.g., chip carrier) 202 supports the integrated circuit (i.e., disposed upon the active side 104 of semiconductor chip 101). The substrate 202 has a substrate core 22 that can be constructed with conventional printed circuit board processes, such as lamination. The exterior planar surfaces 109 (i.e., top surface) and 110 (i.e., bottom surface) of the substrate 202 each contain a plurality of metal foil rings (e.g. planer copper rings) 270 (referring collectively to the plurality of similar metal rings, e.g. 270-1, 270-2, 270-3). The rings may be of any diameter suited for the particular array pattern to be employed. In current designs, metal foil rings having a diameter of about 6 mils (0.1524 millimeters) down to about 2 mils (0.0508 millimeters), inclusive, are advantageous. The metal foil rings form an upper foundation for the firm bonding of the contact pad 290 to the substrate 202. Typically, a solder ball 103 is placed onto each contact pad 290.

The solder balls (i.e., contact anchors 103) are heated and reflowed to bond the balls to the contact pads 290. Each of the contact pads 290 is physically and electrically connected to a corresponding capture pad 212 on a face (e.g., 215-1 or 215-2) of the substrate core 122. Each capture pad 212 is typically formed from a planer metal foil (e.g., copper foil) provided in an core metal layer (i.e., an internal metal layer, e.g., immediately beneath the first dielectric layer 220-1, (e.g., 210-1)) bonded to the underlying dielectric layer (e.g., 120-1) and which has been selectively etched by known etching methods.

Vertical connections, (called vias and/or plated through holes (PTH)) 207 within the substrate core 22 may extend between a first face (e.g., 215-1) of the substrate core 22 to the other face (e.g., 215-2) of the substrate core 22 to allow electrical interconnection between the contact pads 290 on the first surface 109 of the substrate 202 to metal wire traces 205 on internal layers (e.g., interconnection layers between the face layers 210-1 and 210-2) of the substrate core 22 and/or to contact pads 290 or metal wire traces (not shown) on the second (opposite) side 110 of the substrate 202. BGA chip carriers (e.g., substrate 202) generally have vias 207 that interconnect the contact pads 290 on one surface 109 with contact pads 290 on the opposite surface 110 of the substrate 202. The vias 207 may be electrically connected horizontally to the attach pads 290 by metal capture pads 212 in a conventional "dogbone" configuration or by longer metal traces (not shown) on the face(s) 215-1 and 215-2 of the substrate core 22. The vias 207 may be horizontally displaced from the capture pads 212 on a face (e.g. 215-1) so that molten solder does not flow into the vias 207.

FABRICATION OF CONTACT PADS ON THE SUBSTRATE

Figure 2A:
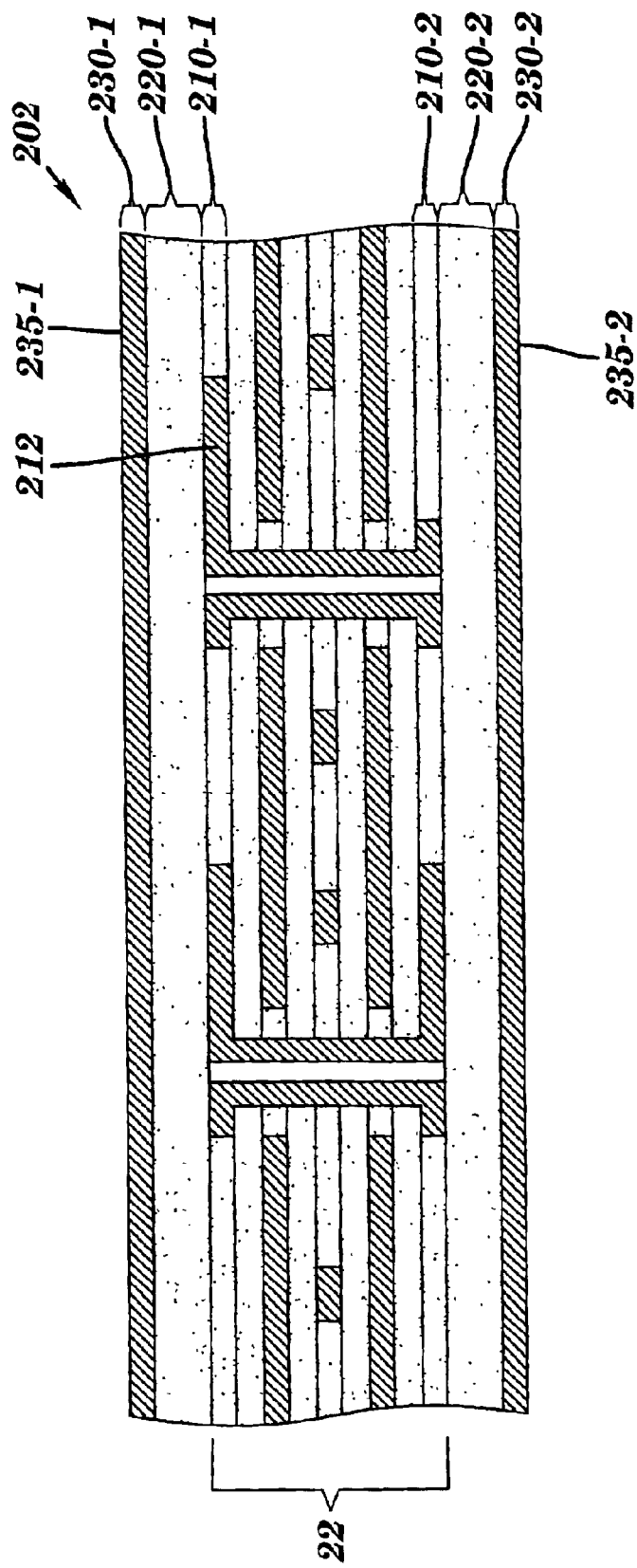
FIGS. 2A–2D depict cross-sectional views of intermediate structures and steps involved in the manufacture of the. interconnection substrate of FIG.1 having flip-chip joinable contact pads on its surface(s) that are formed without external metal plating steps, in accordance with embodiments of the present invention.

FIG. 2A shows the initial step in the method of fabricating the interconnection substrate having flip-chip joinable contact pads (e.g., 290 in FIG.1) on its surface(s) that are formed without external metal plating steps, that of providing a multilayered interconnect substrate 202 including a substrate core 22. FIG. 2A illustrates a cross-sectional view of a multilayered interconnect substrate 202 at an initial point in the process disclosed herein, in accordance with embodiments of the present invention. The multilayered interconnect substrate 202 is formed of alternating stacked metal foil layers and lamination carrier (e.g., a structural dielectric such as Epoxy Resin or PTFE) layers. The multilayered interconnect substrate 202 includes a substrate core 22 having a core metal face layer (e.g., internal copper foil metal face layer 210-1 or 210-2) and at least one external (i.e., top or bottom) metal layer (e.g., 230-1 or 230-2) comprising a layer of metal foil (e.g., copper foil). The multilayered interconnect substrate 202 further includes a dielectric layer (e.g., 220-1 or 220-2) of dielectric material, the dielectric material being disposed between the external metal layer (230-1 or 230-2) and the internal metal face layer 210-1 of the substrate core 22.

The multilayered interconnect substrate 202 having a external metal foil surface layer provides a foundation for the is remaining process steps. Each metal face layer (e.g., 210-1, 210-2) is characterized as being a planar layer containing horizontal conductors (e.g. metal capture pads 212) sandwiched between two adjacent dielectric layers. Each external conductive layer (e.g., external metal layer 230-1) is characterized as being a layer containing an exposed planar metal foil conductor (e.g., copper foil) abutting upon one planar dielectric layer (e.g., 220-1). The external conductive layer may be a copper foil layer or a foil of another metal. The external metal layer will provide a surface that may be etched into a desired pattern by known methods (e.g., chemical etching), and will provide a surface that a solder paste or other conductive paste will adhere to.

Figure 2B:
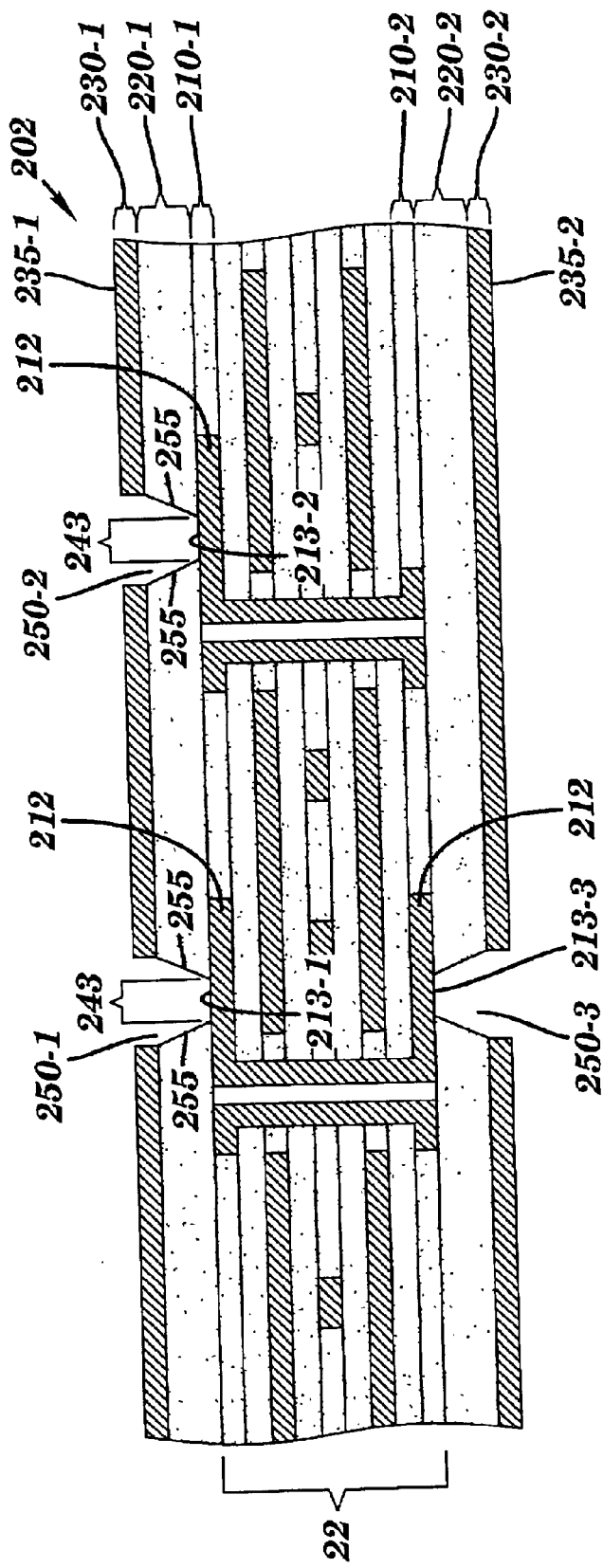

FIG. 2B depicts the result of an intermediate step in the fabrication method, that of perforating the external metal layer (e.g., 230-1 or 230-2) and perforating the underlying area of the dielectric layer.(e.g., 220-1 or 220-2) to create a perforation that exposes a metal surface 213 (referring collectively to each of similar exposed metal surfaces 213-1, 213-2, 213-3) on the capture pads 212 on the face of the substrate core 22. The result of this step provides a microvia cavity (i.e., a short hole extending between two metal layers through a dielectric layer) 250 (referring collectively to similar microvia cavities 250-1, 250-2, and 250-3) extending between the external metal layer (e.g., 230-1 or 230-2) and the next underlying metal layer (e.g., metal face layer 210-1). The microvia cavity 250 can be located above a planar metal conductor, such as a capture pad 212 of an internal metal layer (e.g., metal face layer 210-1 of the substrate core 22), or above any other conductive element at the substrate core 22. When the microvia cavity is filled with a conductive material, the conductive material will make a planar connection with the exposed metal surface 213 of the capture pad 212.

The perforations made through the external metal layer 230-1 and the underlying dielectric layer 220-1 to form microvia cavities 250 may be performed by any known method, including mechanical drilling, punching, plasma etching, chemical etching techniques, laser drilling or laser ablation. The microvia cavities 250 are formed in the substrate 202 at locations where electrical circuitry on one side of the dielectric layer (e.g., 220-1) can be connected to metal (e.g. a capture pad 212) on the opposite side of the dielectric layer. An exposed metal surface 213 (referring to each of exposed metal surfaces 213-1, 213-2, 213-3) of the metal capture pads 212 on the face of the substrate core 22 will be exposed through each of these microvia cavities 250 (referring to each of holes 250-1, 250-2, and 250-3 respectively).

Figure 3A:
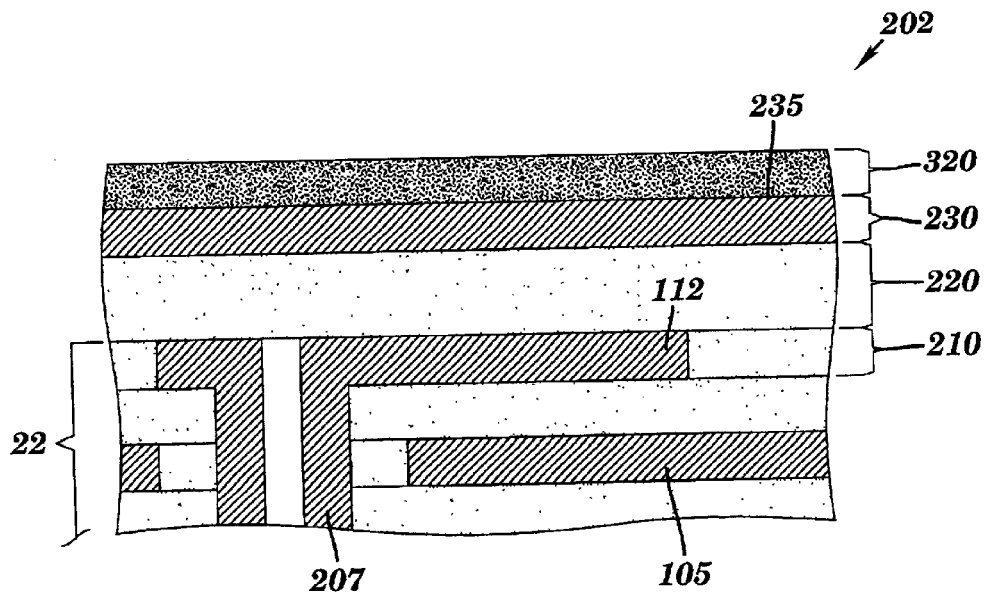
FIGS. 3A–3F depict cross-sectional views of the structures and steps depicted in FIGS. 2A–2D wherein a layer of a strippable mask has been applied upon the external metal foil layer surface(s) in order to facilitate the selective deposition of a conductive/solder paste to form a mass of conductive material as shown in FIG. 2C.
Figure 3B:
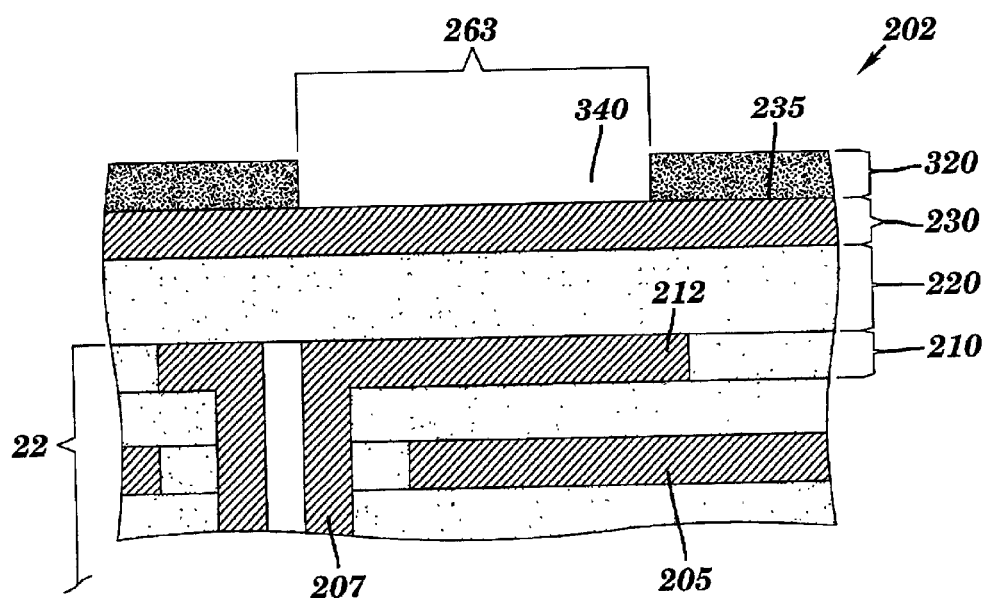
Figure 3C:
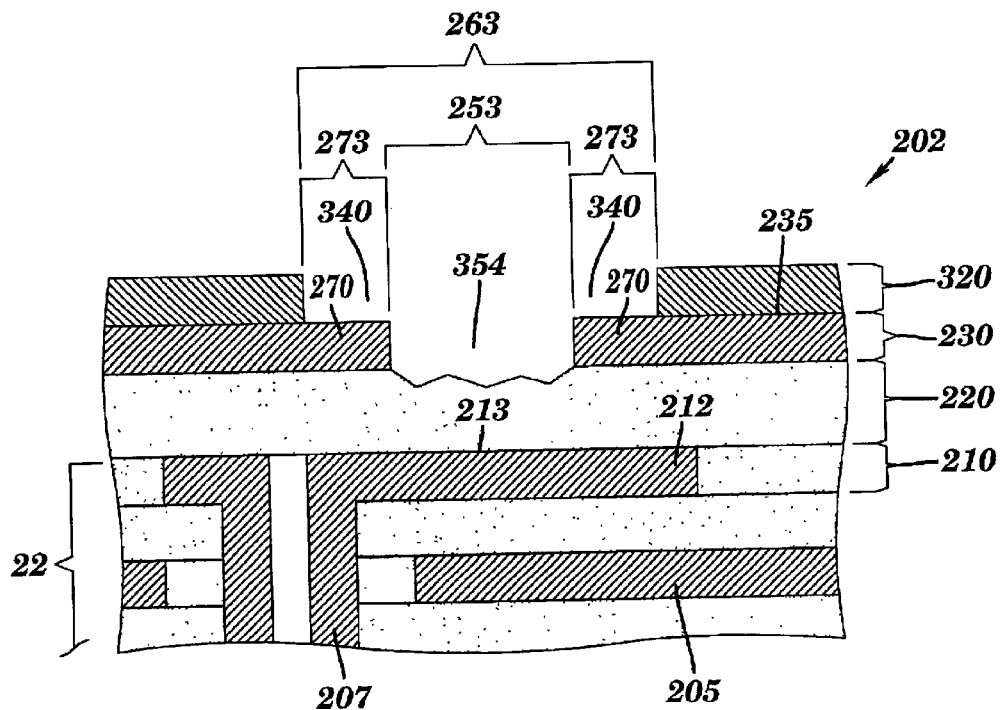

Laser formation of a microvia cavity 250 may be performed in a sequence of steps including the laser ablation of an area of the overlying external metal layer 230-1 using a plurality of laser pulses of sufficient energy to vaporize the metal (e.g., copper) of the external metal layer 230-1 (some collateral damage to the underlying dielectric layer is acceptable because the underlying dielectric material is also to be removed) (See FIG. 3B), followed by a plurality of laser pulses of sufficient energy to ablate the underlying dielectric material of dielectric layer 220-1 but not vaporize the underlying metal capture pad 212 of the underlying metal face layer 210-1 of the substrate core 22 (See FIG. 3C).

The formation of the microvia cavity 250 optimally will not remove a substantial quantity of metal (e.g. copper foil) from the exposed capture pad 212 in the metal face layer 210-1 on the face of the substrate core 22. The exposed metal surface 213 of the metal conductor (e.g., capture pad 212) at the "bottom" of the microvia cavity 250, will form the bottom part of a completed microvia when the microvia cavity 250 has been conformally filled with a conductive material in accordance with embodiments of the invention. For easier filling and adhesion by a conductive/solder paste that will later fill the microvia cavity 250, the side surface 255 of the microvia cavity 250 may be beveled such that the microvia cavity 250 includes a truncated cone shaped hole and a corresponding trapezoidal vertical cross-section (as opposed to a columnar shaped hole having a rectangular cross-section) as depicted in FIG. 2B. The microvia cavities 250 will subsequently be conformally filled with a conductive paste (e.g., solder paste, reflowed solder, a curable conductive paste, or a conductive adhesive) to form a cavity substantially filled with a conductive material (referred to hereinafter as a filled microvia).

Figure 2C:
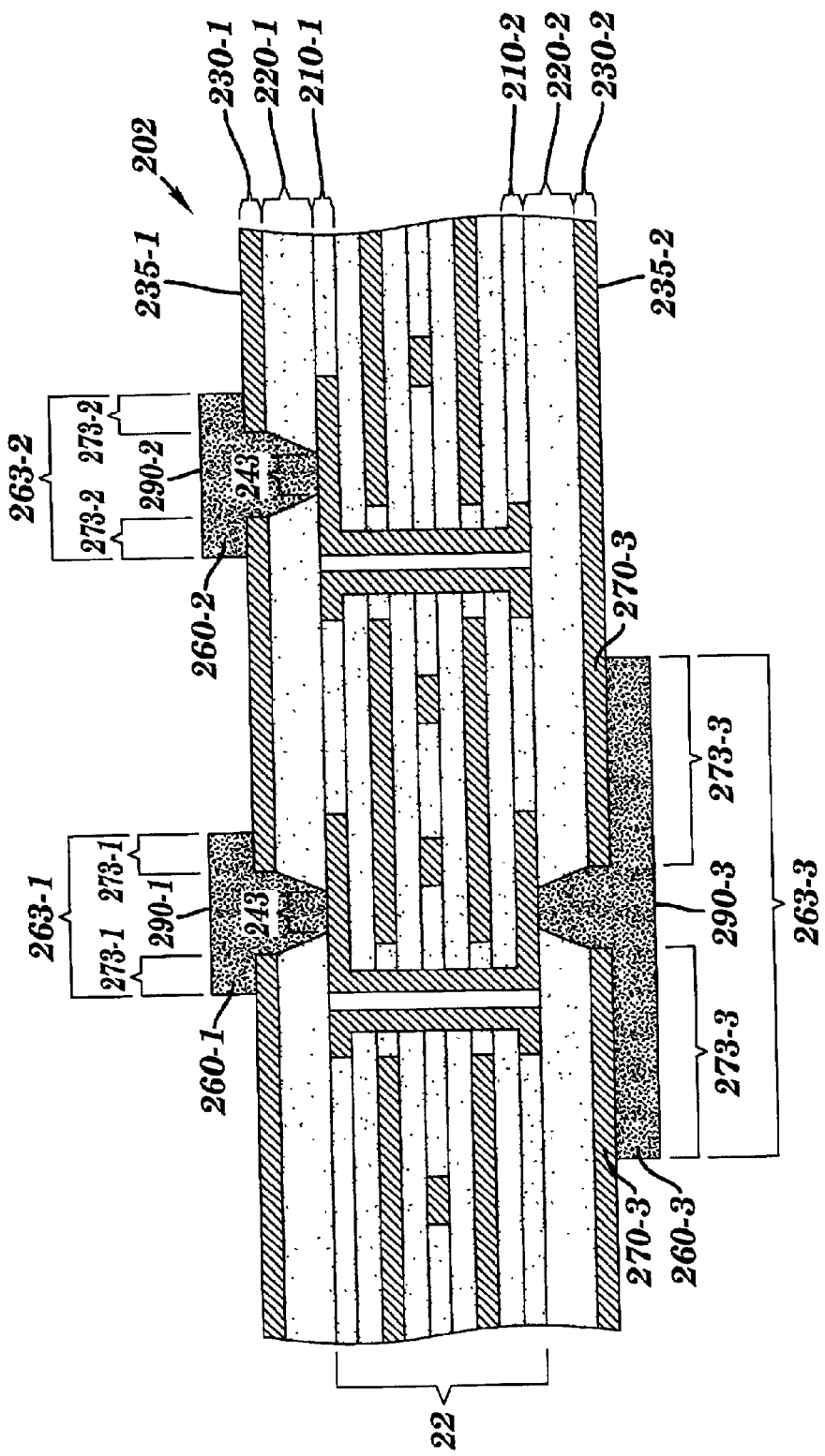

FIG. 2C depicts a cross-sectional view of the multilayered interconnect substrate of FIG. 2B after a mass of a conductive/solder paste 260 (referring collectively to similar masses of conductive/solder paste 260-1, 260-2, 260-3) (e.g., a conductive paste, a solder paste or any other material that cures to form a solid conducting mass) has been conformally deposited to fill the perforations (i.e., microvia cavities 250 as shown in FIG. 2B) through the dielectric layer 220-1. The conductive material (herein referred to as a conductive/solder paste) 260 has been further deposited selectively upon the surface 235 (e.g., 235-1 and 235-2) of the external metal layer(s) 230 (e.g., 230-1 and 230-2) of the substrate 202 within a selected area 263 (including peripheral area 273 e.g., 273-1, 273-2, 273-3) that is approximately centered around the microvia cavity 250, to form a layer of conductive/solder paste 260 upon and in direct contact with the external metal layer (e.g., 230-1 or 230-2) within the selected area 263.

The mass of conductive/solder paste 260 selectively deposited conformally upon the external metal layer 230-1 and 230-2 can have the physical and/or chemical property of having a low etch-rate relative to the etch-rate of the metal (e.g., copper metal) of the external metal layer (e.g., 230-1) for the etching chemical or etching process to be used to remove exposed metal from the external metal layer (e.g., 230-1 or 230-2). The conductive/solder paste 260 when uncured should also adhere somewhat (i.e., not separate during handling) and when cured bond firmly to the surfaces of the substrate it is applied to (e.g., metal in the peripheral area 273 of the external metal layer 230-1 of the substrate 202, and the metal surface 213 in the central area 243 on the metal face layer 210-1 of the substrate core 22). The conductive/solder paste 260 will be selectively deposited over a selected area 263 of the substrate 202 that includes the central area 243 and the peripheral area 273. Conversely, the conductive/solder paste 260 will not be deposited upon a surrounding area that includes the area adjacent to (i.e., external to) the selected area 263.

The conductive/solder paste 260 will therefore have the properties of an etch "mask," for use in any known etching process employed to selectively remove the metal (e.g., copper metal) of metal layer 230-1 of the surrounding area that is not covered by the conductive/solder paste 260. The mass of conductive/solder paste 260 selectively deposited upon the surface of the substrate 202 and conformally filling the microvia cavity 250 (shown in FIG. 2B) can be a mass having a planar surface forming a contact pad located parallel to and opposite the first contact area or the mass may be a solder ball, a solder column, or other electrically conductive adhesive bump.

The mass of conductive/solder paste 260 can be selectively deposited into and around the microvia cavity as depicted in FIG. 2C by numerous conventional methods known to persons skilled in the art. Such methods of selectively depositing the conductive material may include selective printing, jetting or solder ball placement techniques. The selectively deposited conductive material may be a conductive paste, such as a solder paste, liquid solder or solder particles, and other materials which are reflowable and/or curable to form the mass of conducting material. The conductive/solder paste 260 is bondable to the exposed metal surface(s) of the metal face layer (e.g. 210-1 and 230-1). The conductive/solder paste 260 may optionally be bondable to the non-metallized microvia cavity walls 255. The bonding characteristic of the conductive material may require the application of a curing process known to persons skilled in the art such as drying or the application of heat or a certain form of energy such as laser or infrared light. The conductive material 260 may be a conductive paste, solder paste, and/or solder particles that can be filled conformally into the microvia cavities 250 (shown in FIG. 2B).

Figure 2D:
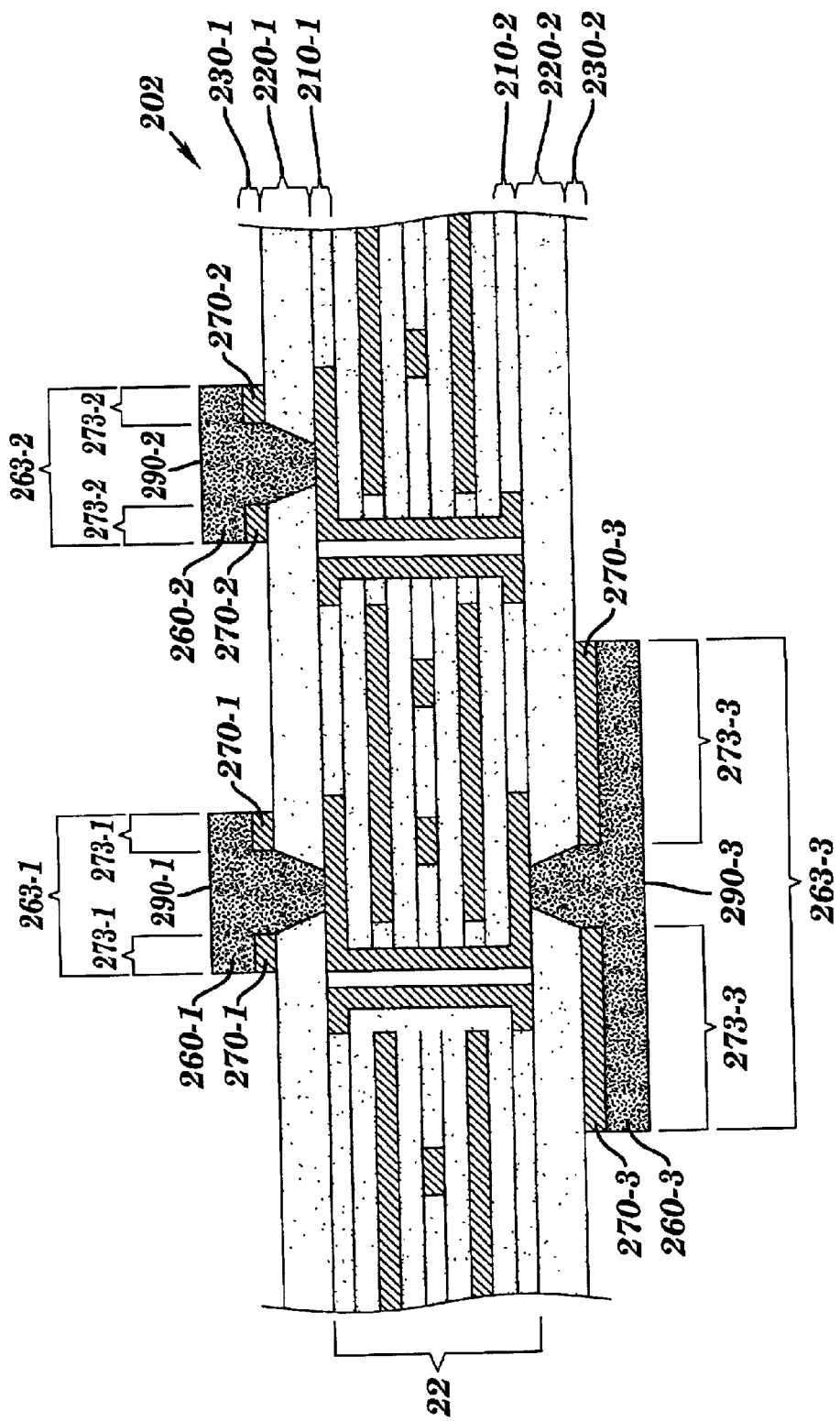

FIG. 2D (cross-sectional view) depicts the multilayered interconnect substrate of FIG. 2C after the exposed metal (outside of the peripheral area 273 covered by the conductive material 260) of the external metal (foil) layer (e.g., 230-1) has been etched away, using the selectively deposited conductive material 260 as an etch mask, leaving a peripheral area 273 of the external metal (foil) layer (e.g., 230-1) that is covered by and bonded to the deposited conductive/solder paste 260. The resulting structure shown in FIG. 2D includes completed conductive contact pads 290 (e.g., flip-chip joinable contact pads 290-1, 290-2, 290-3) each having an electrical connection with conductive elements (e.g., metal capture pads 212) of the substrate core 22 in accordance with embodiments of the invention. The completed conductive contact pads 290 have become an integral part of the substrate 202.

STRIPPABLE MASK METHOD

FIGS. 3A–3F include magnified cross-sectional views of the structures and steps depicted in FIGS. 2A–2D wherein an additional layer for forming a strippable mask has been applied upon the metal surface(s) (e.g., 235-1) of external metal layer 230 of the substrate 202 in order to facilitate a selective deposition of the conductive/solder paste 260.

FIG. 3A depicts the substrate 202 of FIG. 2A with the addition of a strippable mask layer 320. The strippable mask composition applied to form the mask layer(s) (e.g. 320) upon the metal surface 235 (e.g., metal surface 235-1 of FIG. 2A) of the external metal layer 230 (e.g., layer 230-1 of FIG. 2A) of the substrate 202 may be selected from among the many strippable mask compositions known to persons skilled in the art. It is believed that the strippable mask composition commercially manufactured and distributed by Dupont called Vacrel™ is a suitable composition to form strippable mask layer(s) (e.g. 320) upon the metal (foil) surface(s) of the substrate 202. In general, the strippable mask composition should be dimensionally stable at and around the curing temperature or reflow temperature of the conductive/solder paste (e.g., 260 shown in FIG. 3E). The strippable mask should adhere to the metal (e.g. copper) surface (e.g. 235) of the substrate 202 until intentionally stripped off. The strippable mask composition may be applied as a fluid (e.g., a paste) to form a layer on the substrate 202, or purchased and applied as a film that is laminatable to the external metal surface(s) (e.g., surface 235 of external metal layer 230) of the substrate to form a layer thereon. Optionally, the strippable mask composition can have the properties of a photoresist masking composition well known in the art wherein selected area(s) 263 of the mask layer that shall have been exposed to light will have different resistance to stripping by a given stripping chemical than the areas of the mask layer that are not-exposed to such light. Such an optional photoresist property will facilitate the lithographic patterning of screen holes (e.g., 340 in FIG. 3B) through the mask layer(s) (e.g. 320).

FIG. 3B depicts a cross-sectional view of the substrate depicted in FIG. 3A wherein the strippable mask.(e.g., 320) has been selectively removed from above selected area(s) 263 of the external metal layer (e.g., 230) approximately centered above the metal capture pads 212 on the face of the substrate core 22, thus forming screen hole(s) (e.g., 340) to facilitate the later selective deposition (e.g., screening on) of the conductive/solder paste (e.g., 260 shown in FIG. 3E). Alternatively, FIG. 3B depicts a cross-sectional view of-the substrate depicted in FIG. 2A wherein a layer of strippable mask (e.g., 320) has been applied to a surrounding area of the surface 235 of the substrate 202 but not applied to a selected area (e.g., 263) of the external metal layer (e.g., 230) that is approximately centered above the metal capture pads 212 on the face of the substrate core 22, thus forming screen hole(s) (e.g., 340). The screen hole(s) 340 will facilitate the later selective deposition (e.g., screening on) of the conductive/solder paste (e.g., shown in FIG. 3E) upon the selected area 263 of the surface of the substrate 202.

Figure 3D:
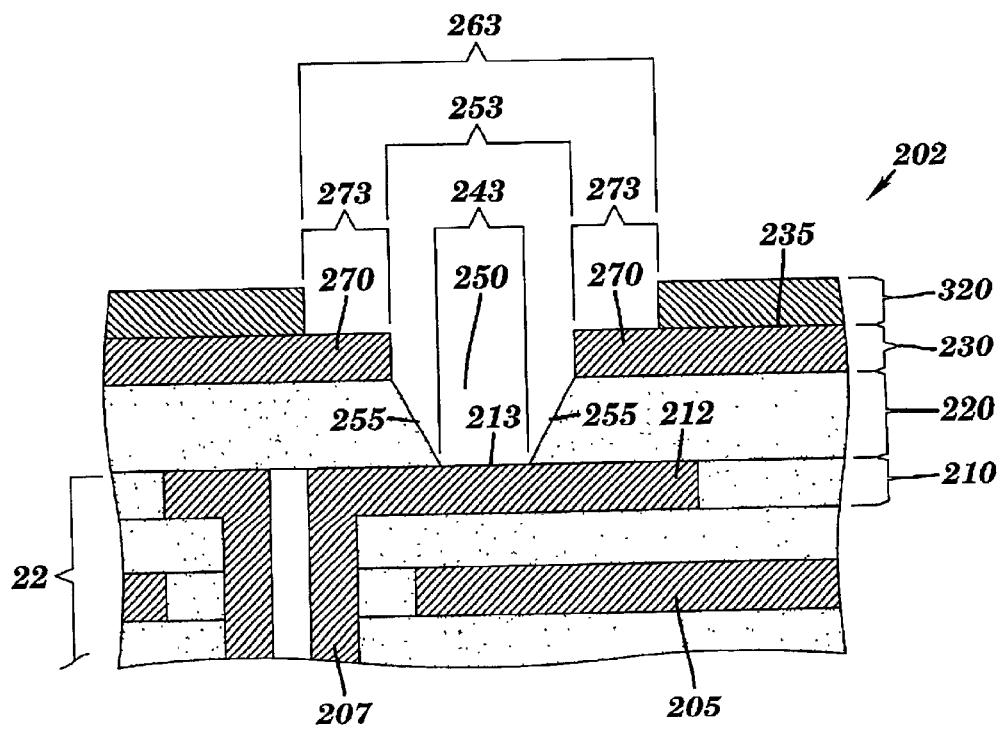

The removal (or patterned omission) of selected areas (e.g. 263) of the strippable mask layer (e.g. 320) may be performed by any known method, including mechanical drilling, lithography, punching, plasma etching, chemical etching techniques, laser drilling or laser ablation. The screen holes 340 are formed in the strippable mask layer 320 within selected (screen hole) areas (e.g. 263) that include and are approximately centered around smaller microvia areas (see e.g., microvia area 253 in relation to selected area 263 in FIG. 3C) on the surface of the substrate 202 through which microvia cavities (e.g., 250 as shown in FIG. 3D) shall be formed. Each screen hole 340 may have an approximately circular perimeter shape (as depicted by the perimeter of area 263 in FIG. 3B), but may have any arbitrary perimeter shape that includes (i.e., contains) an approximately annular area (e.g., a flat ring) (e.g. peripheral area 273-1 in FIGS. 2C and 2D and peripheral area 273 in FIG. 3C) that is approximately centered around the microvia area (e.g. area 253 in FIGS. 3C and 3D) of the microvia cavity 250. The peripheral portion of the selected area 263 (e.g., of the screen hole 340, including at least an annular planar area 273 and not including the centralized microvia area 253, will define the planar surface area of a flat metal foil ring (e.g. copper foil ring 270 shown in FIG. 3F) that shall remain upon the surface of the substrate 202 to provide an electrical connection and a mechanical bond with the conductive/solder paste 260 that shall be selectively deposited thereupon.

FIG. 3C depicts a cross-sectional view of the substrate 202 depicted in FIG. 3B wherein the external metal layer (e.g., 230) of the substrate 202 and a portion of the underlying dielectric layer (e.g., 220) have been perforated (e.g., by laser ablation) within a microvia area 253 above the metal capture pad 212. Each such perforation 354 of the substrate 202 is made within a microvia area 253 defined for forming a microvia cavity (e.g., 250 as shown in FIG. 2C). Each such perforation 354 shall be formed through the external metal layer (e.g. 230) and (as shown in FIG. 3D) extended through the underlying dielectric layer 220 to a metal surface 213 of the underlying metal face layer 210 of the substrate core 22 to form a microvia cavity.

FIG. 3D depicts a cross-sectional view of the substrate depicted in FIGS. 3B or 3C wherein a microvia area 253 of the external metal layer 230 and of underlying dielectric layer 220 has been perforated to form a microvia cavity 250 extending to the metal surface 213 of the capture pad 212 on the metal face layer 210 of the substrate core 22. The structure of FIG. 3D is substantially the same as the structure of FIG. 2B except that in FIG. 3D a patterned layer of strippable mask 320 is adhered to the metal surface 235 (e.g., 235-1 in FIG. 2B) of the external metal layer 230 (e.g., 230-1 in FIG. 2B) of the substrate 202.

Figure 3E:
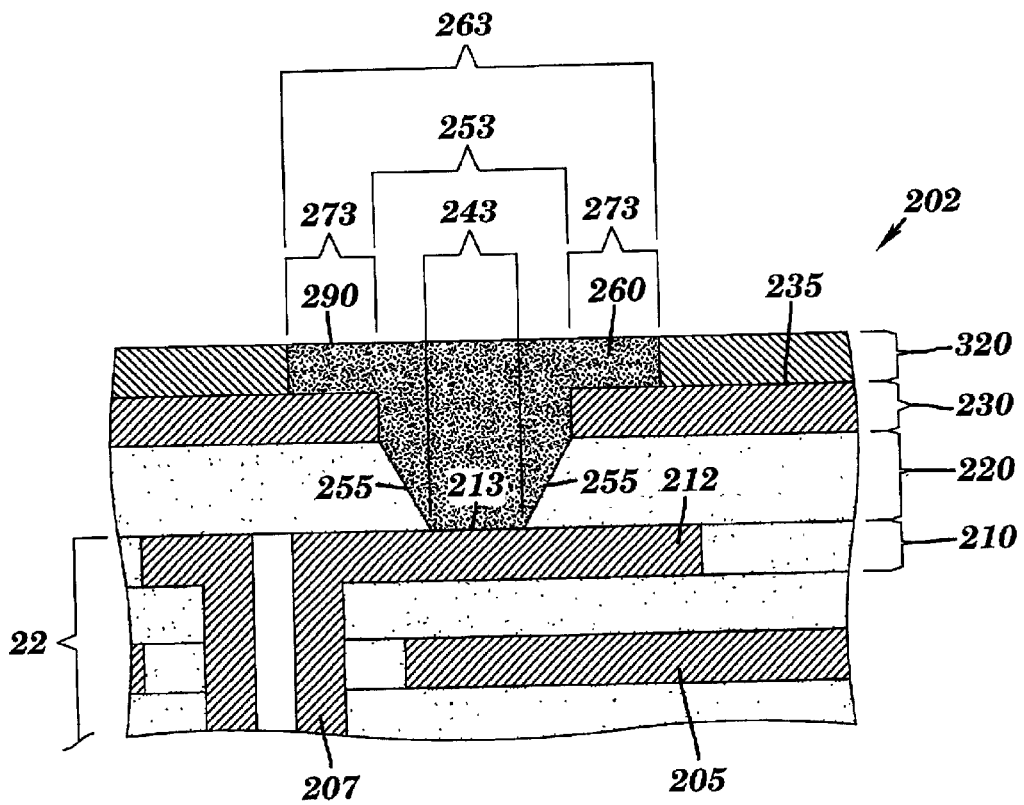

FIG. 3E depicts a cross-sectional view of the substrate depicted in FIG. 3D after the screen hole(s) 340 in the strippable mask layer 320 and the microvia cavit(ies) 250 in the substrate 202 have been conformally filled with the mass of conductive/solder paste 260. In FIG. 3E, the screen hole(s) 340 and underlying microvia cavities 250 of the structure of FIG. 3D have been conformally filled-in with a mass of conductive/solder paste 260 (e.g., which may have the same form and composition as masses of conductive/solder paste 260-1, 260-2, 260-3 in FIGS. 2C and 2D).

The mass of conductive/solder paste 260 is in adhering contact with surfaces of two exposed metal layers (e.g. surface 235 of the external metal layer 230 within peripheral (ring) area 273, and surface 213 of the core's metal face layer 210 within the central area 243). The conductive/solder paste 260 may optionally be in adhering contact with the side surface 255 of the microvia cavity (e.g., 250 shown in FIG. 3D).

After any necessary curing of the conductive/solder paste 260, the conductive paste 260 will be firmly and permanently bonded to the metal surfaces (i.e. surfaces 213 and 235) within in each area (i.e., 243 and 273 respectively). The conductive/solder paste 260 will also optionally be bonded to the side surface 255 of the microvia cavity (250 of FIG. 3D). The conductive paste 260 (e.g., cured solder paste or reflowed solder balls) will form an electrically conductive connection, i.e., a filled microvia, between two metal layers (e.g., between external metal layer 230 and core's metal face layer 210) of the substrate 202. The conductive paste 260 may also form a planar contact pad 290 (like contact pads 290-1, 290-2, 290-3 as shown in FIG. 2D) upon the surface of the substrate 202 for electrically joining external circuits (e.g. circuits on flip-chip 101 shown in FIG. 1) to conductors (e.g. vias 207 with capture pads 212 and/or wire traces 205) within the substrate core 22. In order to prevent undesired electrical conduction (e.g., undesired shorting) between adjacent and remote contact pads 290 (e.g., between a plurality of contact pads 290-1 and 290-2 on the same external surface of the substrate as shown in FIG. 2C) it is necessary to remove excess (non-selected) metal of the external metal layer (e.g., 230) from the broad surrounding area (e.g., the non-masked area) that is not covered (i.e., masked) by the mass of conductive paste 260.

Figure 3F:
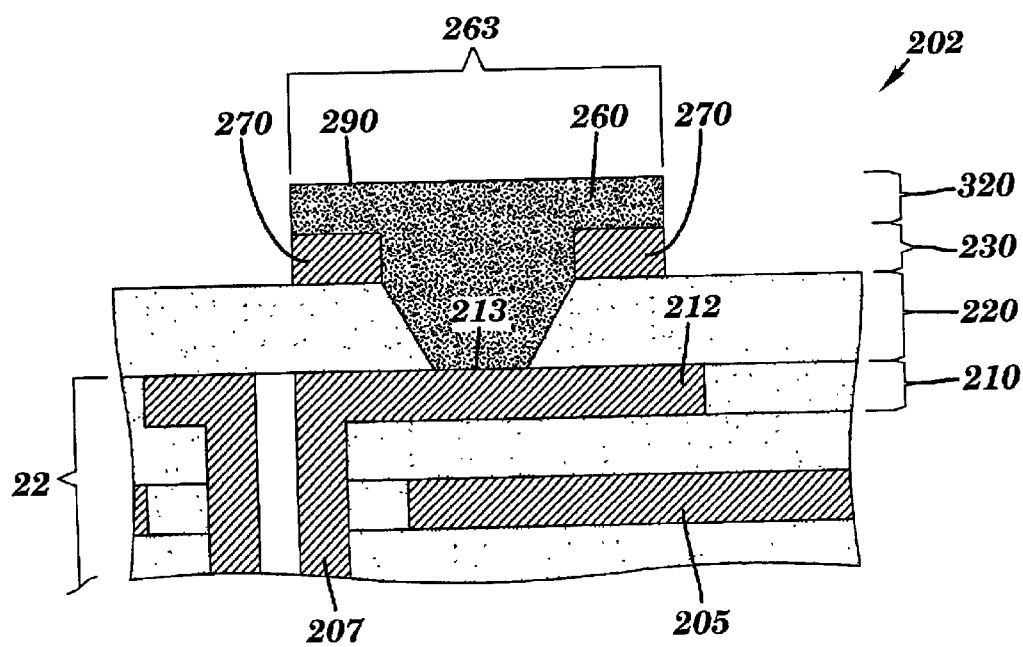

FIG. 3F depicts a cross-sectional view of the multilayered interconnect substrate of FIG. 3E after the patterned strippable mask (e.g. 320 of FIG. 3B) has been stripped off and after the exposed (i.e., non-masked) area of the metal layer 230 on the surface of the substrate 202 has been etched off using the selectively deposited conductive/solder paste as an etch-mask. The resulting substrate 202 shown in FIG. 3F includes completed conductive contact pad(s) 290 (i.e., flip-chip joinable contact pad 290) having an electrical connection with conductive elements (e.g., metal capture pads 212) of the substrate core 22.

The inventive substrate 202 including the non-plated contact pads 290 and the filled microvia cavities (see e.g., microvia cavity 250 in FIG. 3C) filled with conductive/solder paste 260 may be used to form electronic assemblies (e.g. flip-chip assemblies), such as for example, the assembly depicted in FIG. 1.

While exemplary embodiments of the present invention have been described herein for purposes of illustration, many variations, equivalents, modifications and changes will be apparent to those skilled in the art. Accordingly, the appended claims are intended to encompass all such variations, equivalents, modifications and changes as fall within the true spirit and scope of the disclosed invention.

We claim:

1. An electronic structure comprising:
   a substrate having a dielectric layer between a first metal layer and a second metal layer, the second metal layer being disposed above the first metal layer, the first metal layer having a first contact area, the second metal layer having a top surface that includes a selected area disposed above the first contact area;
   a microvia cavity within the selected area being disposed through the second metal layer and through the dielectric layer and extending to the first contact area of the first metal layer; and
   a mass of a single conductive material, wherein a first portion of the mass forms an external layer upon the selected area of the top surface of the second metal layer such that the external layer is external to the microvia cavity and external to the substrate, and wherein a second portion of the mass totally fills the microvia cavity and is in contact with the first contact area of the first metal layer.

2. The structure of claim 1, wherein the mass of the single conductive material conformally fills the microvia cavity.

3. The structure of claim 1, wherein the mass of the single conductive material has a planar surface forming a contact pad located parallel to and opposite the first contact area of the first metal layer.

4. The structure of claim 1, wherein selected area is approximately centered around the first contact area.

5. The structure of claim 4, wherein the second metal layer within the selected area is approximately centered around the microvia cavity.

6. The structure of claim 1, wherein the second metal layer within the selected area is approximately centered around the first contact area.

7. The structure of claim 1, wherein the second metal layer contains a flat copper ring around the microvia cavity.

8. The structure of claim 1, wherein the microvia cavity includes a truncated cone-shaped hole in the dielectric layer.

9. The structure of claim 1, wherein the mass of the single conductive material comprises at least one of a solder paste, a reflowable solder, a conductive paste, and a conductive adhesive.

10. The structure of claim 1, wherein the selected area is a planar area.

11. The structure of claim 1, wherein the selected area is a planar area that is about parallel to a planar top surface of the first metal layer.

12. The structure of claim 1, wherein an etch rate of the single conductive material is less than an etch rate of a metal comprised by the second metal layer.

13. The structure of claim 1, wherein the single conductive material is bondable to a wall of the microvia cavity.

14. An assembly comprising:

a semiconductor chip;

a substrate having a dielectric layer between a first metal layer and a second metal layer, the second metal layer being disposed above the first metal layer, the first metal layer having a first contact area, the second metal layer having a top surface that includes a selected area disposed above the first contact area;

a microvia cavity within the selected area being disposed through the second metal layer and through the dielectric layer and extending to the first contact area of the first metal layer; and a continuous mass of a single conductive material, wherein a first portion of the mass forms an external layer upon the selected area of the top surface of the second metal layer such that the external layer is external to the microvia cavity and external to the substrate, wherein a second portion of the mass totally fills the microvia cavity and is in contact with the first contact area of the first metal layer, and wherein the semiconductor chip is electrically connected to the mass of the single conductive material.

15. The assembly of claim 14, wherein the selected area is a planar area.

16. The assembly of claim 14, wherein the selected area is a planar area that is about parallel to a planar top surface of the first metal layer.

17. The assembly of claim 14, wherein an etch rate of the single conductive material is less than an etch rate of a metal comprised by the second metal layer.

18. The assembly of claim 14, wherein the single conductive material is bondable to a wall of the microvia cavity.

19. An assembly comprising:

a semiconductor chip;

a substrate having a dielectric layer between a first metal layer and a second metal layer, the second metal layer being disposed above the first metal layer, the first metal layer having a first contact area, the second metal layer having a top surface that includes a selected area disposed above the first contact area;

a microvia cavity within the selected area being disposed through the second metal layer and through the dielectric layer and extending to the first contact area of the first metal layer; and a mass of a single conductive material forming a layer upon the selected area of the top surface of the second metal layer and totally filling the microvia cavity and being in contact with the first contact area of the first metal layer, wherein the semiconductor chip is electrically connected to the mass of the single conductive material, wherein the single conductive material is not bondable to a wall of the microvia cavity.

20. An electronic structure comprising:

a substrate having a dielectric layer between a first metal layer and a second metal layer, the second metal layer being disposed above the first metal layer, the first metal layer having a first contact area, the second metal layer having a top surface that includes a selected area disposed above the first contact area;

a microvia cavity within the selected area being disposed through the second metal layer and through the dielectric layer and extending to the first contact area of the first metal layer; and a mass of a single conductive material forming a layer upon the selected area of the top surface of the second metal layer and totally filling the microvia cavity and being in contact with the first contact area of the first metal layer, wherein the single conductive material is not bondable to a wall of the microvia cavity.

* * * * *